US009641937B2

(12) United States Patent
Kuromoto

(10) Patent No.: US 9,641,937 B2
(45) Date of Patent: May 2, 2017

(54) DIGITAL AMPLIFIER, THREE-VALUE SIGNAL OUTPUT METHOD AND SPEAKER

(71) Applicant: CLARION CO., LTD., Saitama (JP)

(72) Inventor: Shinichi Kuromoto, Saitama (JP)

(73) Assignee: CLARION CO., LTD., Saitama-Shi, Saitama (JP)

( * ) Notice: Subject to any disclaimer, the term of this patent is extended or adjusted under 35 U.S.C. 154(b) by 0 days.

(21) Appl. No.: 14/769,640

(22) PCT Filed: Jan. 14, 2014

(86) PCT No.: PCT/JP2014/050446
§ 371 (c)(1),
(2) Date: Aug. 21, 2015

(87) PCT Pub. No.: WO2014/132683
PCT Pub. Date: Sep. 4, 2014

(65) Prior Publication Data
US 2015/0382109 A1     Dec. 31, 2015

(30) Foreign Application Priority Data

Feb. 28, 2013   (JP) .................................. 2013-038694

(51) Int. Cl.
*H03F 3/217*     (2006.01)
*H03F 3/68*      (2006.01)
(Continued)

(52) U.S. Cl.
CPC ............. *H04R 5/04* (2013.01); *H03F 1/0205* (2013.01); *H03F 3/185* (2013.01); *H03F 3/2171* (2013.01);
(Continued)

(58) Field of Classification Search
CPC ........ H03F 3/2171; H03F 3/185; H03F 3/217; H03F 3/45; H03F 2200/372; G09G 2330/021
(Continued)

(56) References Cited

U.S. PATENT DOCUMENTS 4,894,621 A    1/1990  Koenig et al.
5,930,370 A    7/1999  Ruzicka
(Continued)

FOREIGN PATENT DOCUMENTS

EP      2309638 A1    4/2011
JP     11-112245 A    4/1999
(Continued)

OTHER PUBLICATIONS

International Search Report issued for corresponding PCT/JP2014/050446 application.
(Continued)

*Primary Examiner* — George Monikang
(74) *Attorney, Agent, or Firm* — IP Business Solutions, LLC

(57) ABSTRACT

Noise is reduced when three-value output is performed. In a digital amplifier 1, a three-value driver 18a associated with a positive electrode and a three-value driver 18b output three-value signals which are inverted to each other, and execute an output of three values on the basis of a differential output of the positive electrode and a negative electrode.

4 Claims, 15 Drawing Sheets

(51) Int. Cl.
*H03G 3/32* (2006.01)
*H04R 5/04* (2006.01)
*H03F 3/185* (2006.01)
*H03F 1/02* (2006.01)
*H04S 3/00* (2006.01)
*H04R 3/00* (2006.01)

(52) U.S. Cl.
CPC ........... *H03F 3/2173* (2013.01); *H04S 3/008* (2013.01); *H03F 2200/03* (2013.01); *H04R 3/00* (2013.01); *H04R 2420/01* (2013.01)

(58) Field of Classification Search
USPC .......................... 330/251, 252; 381/57, 120
See application file for complete search history.

(56) References Cited

U.S. PATENT DOCUMENTS

| | | | |
|---|---|---|---|
| 2005/0030093 A1* | 2/2005 | Olson | H03F 3/2173 330/10 |
| 2005/0078848 A1 | 4/2005 | Hlibowicki | |
| 2008/0042745 A1* | 2/2008 | Kozak | H03F 1/02 330/251 |
| 2008/0068075 A1* | 3/2008 | D'Aquino | H03F 3/211 330/69 |
| 2011/0160883 A1 | 6/2011 | Yasuda et al. | |
| 2011/0260793 A1 | 10/2011 | Jiang et al. | |
| 2012/0230518 A1 | 9/2012 | Siek | |
| 2013/0223651 A1 | 8/2013 | Hoyerby | |

FOREIGN PATENT DOCUMENTS

| | | |
|---|---|---|
| JP | 2000-295049 A | 10/2000 |
| JP | 2005-303372 A | 10/2005 |
| JP | 2007-36736 A | 2/2007 |
| WO | 2011/074341 A1 | 6/2011 |
| WO | 2012/055968 A1 | 5/2012 |

OTHER PUBLICATIONS

International Preliminary Report on Patentability issued for corresponding PCT/JP2014/050446 application.
Supplementary Partial European Search Report issued on Oct. 10, 2016 in the corresponding 14757018.8 application.
Extended European Search Report issued for corresponding European patent application No. 14 75 7018.
Shiang-Hwua Yu et al., "Modulation and Control of a Three-Level Class-D Audio Power Amplifier", Department of Electrical Engineering National Sun Yat-Sen University, IEEE PEDS 2005, pp. 1447-1450.
Rossella Bassoli et al., "A Robust Pseudo-Ternary Modulation Scheme for Filter-Less Digital Class D Amplifiers", Audio Engineering Society COnvention Paper 8196, Presented at the 129th Convention Nov. 4-7, 2010, San Francisco, CA, USA.

* cited by examiner

FIG.2
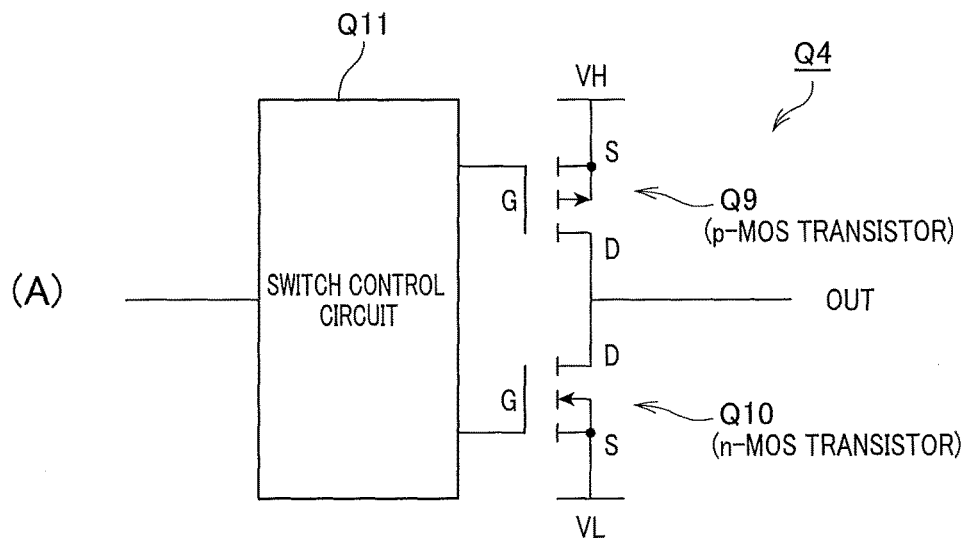
(A)
S: SOURCE, D: DRAIN, G: GATE
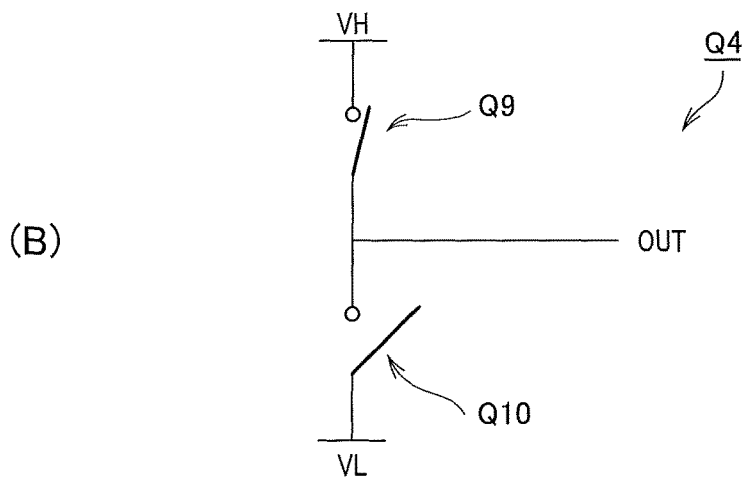
(B)

FIG.9
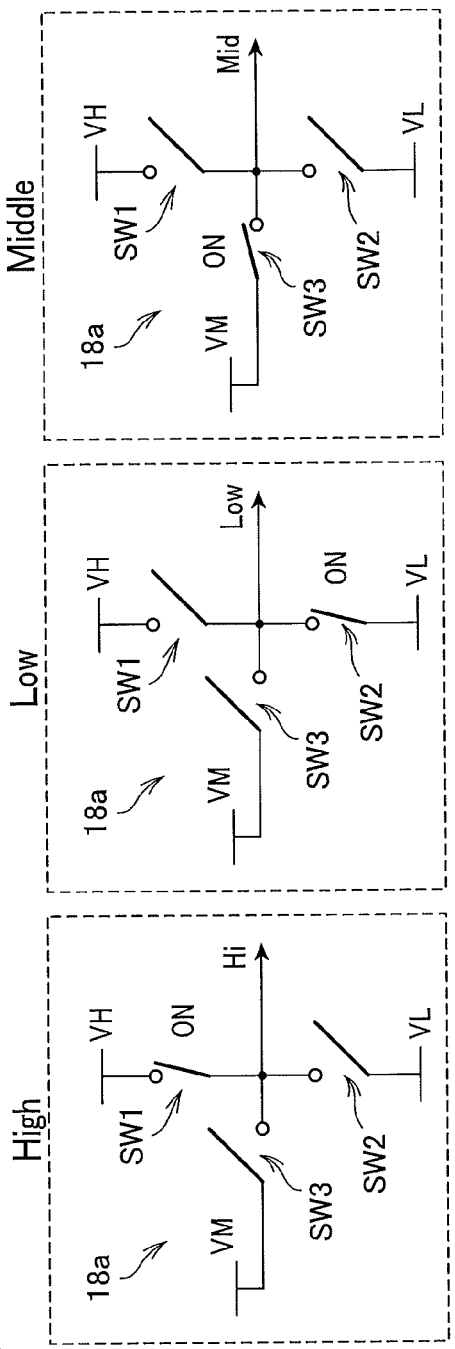
(A)
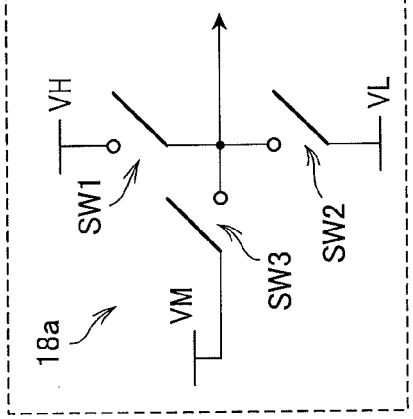
(B)

DIGITAL AMPLIFIER, THREE-VALUE SIGNAL OUTPUT METHOD AND SPEAKER

TECHNICAL FIELD

The present invention relates to a digital amplifier for processing digital signals, a three-value signal output method and a speaker having the digital amplifier.

BACKGROUND ART

A digital amplifier for outputting two-value or three-value signals on the basis of an input has been hitherto known (see Patent Document 1, for example).

PRIOR ART DOCUMENT

Patent Document

Patent Document: JP-A-2005-303372

SUMMARY OF THE INVENTION

Problem to be Solved by the Invention

Here, it is assumed that 3-value signals are output in a digital amplifier. This makes it expectable to perform an operation with a lower power consumption as compared with a digital amplifier for outputting two-value signals. In this case, it has been needed to reduce noise occurring due to an output of three-value as less as possible.

The present invention has been implemented in view of the foregoing situation, and has an object to provide a digital amplifier in which noise is reduced when three-value is output, a three-value output method and a speaker.

Means of Solving the Problem

In order to attain the above object, according to the preset invention, a digital amplifier is characterized in that a signal output circuit associated with a positive electrode and a signal output circuit associated with a negative electrode respectively output three-value signals that are inverted to each other, and execute three-value output on the basis of a differential output of the positive electrode and the negative electrode.

The present invention is characterized in that a signal representing three values is input from a pre-stage circuit to the signal output circuit associated with the positive electrode, the signal representing the three values is branched, inverted and input to the signal output circuit associated with the negative electrode, and the signal output circuit associated with the positive electrode and the signal output circuit associated with the negative electrode output mutually inverted three-value signals on the basis of inputs thereto.

Furthermore, the present invention is characterized in that each of the signal output circuit associated with the positive electrode and the signal output circuit of the negative electrode has power sources having three kinds of potential outputs, three switches connected to the respective power sources, and a switch control circuit, and outputs a three-value signal by switching the respective switches with the switch control circuit.

The present invention is characterized in that a period for which all the three switches are turned off is provided at a switching time when the three switches are switched by the switch control circuit.

Furthermore, in order to attain the above object, according to the present invention, a three-value signal output method is characterized in that a signal output circuit associated with a positive electrode and a signal output circuit associated with a negative electrode respectively output three-value signals that are inverted to each other, and execute three-value output on the basis of a differential output of the positive electrode and the negative electrode.

The present invention is characterized in that a signal representing three values is input from a pre-stage circuit to the signal output circuit associated with the positive electrode, the signal representing the three values is branched, inverted and input to the signal output circuit associated with the negative electrode, and the signal output circuit associated with the positive electrode and the signal output circuit associated with the negative electrode output mutually inverted three-value signals on the basis of inputs thereto.

The present invention is characterized in that each of the signal output circuit associated with the positive electrode and the signal output circuit of the negative electrode has power sources having three kinds of potential outputs, three switches connected to the respective power sources, and a switch control circuit, and outputs a three-value signal by operating the respective switches with the switch control circuit.

The present invention is characterized in that when a switching operation of the three switches is executed, the switching operation is executed after the switch control circuit sets all the switches to OFF-state.

In order to attain the above object, a speaker adaptable to multichannel is characterized in that the speaker has a digital amplifier for each channel, and the digital amplifier in which a signal output circuit associated a positive electrode and a signal output circuit associated with a negative electrode output three-value signals which are inverted to each other, and three-value output is executed on the basis of a differential output of the positive electrode and the negative electrode.

The present invention is characterized in that the speaker has a coil for each of channels, and an output of the signal output circuit associated with the positive electrode and an output of the signal output circuit associated with the negative electrode which are equipped to the digital amplifier and correspond to one of the channels is output to the coil corresponding to the one of the channels.

Effect of the Invention

According to the present invention, when three-value output is performed, noise can be reduced.

BRIEF DESCRIPTION OF THE DRAWINGS

FIG. 2 is a diagram showing a conventional D-class driver.

FIG. 9 is diagrams showing the relationship between the ON/OFF state of each switch equipped to the three-value driver and the output thereof.

MODE FOR CARRYING OUT THE INVENTION

An embodiment according to the present invention will be described hereunder with reference to the drawings.

First, the construction of a conventional digital amplifier will be described, and the problem of the conventional digital amplifier, particularly the problem of a digital amplifier for outputting a three-value will be described.

Figure 1:
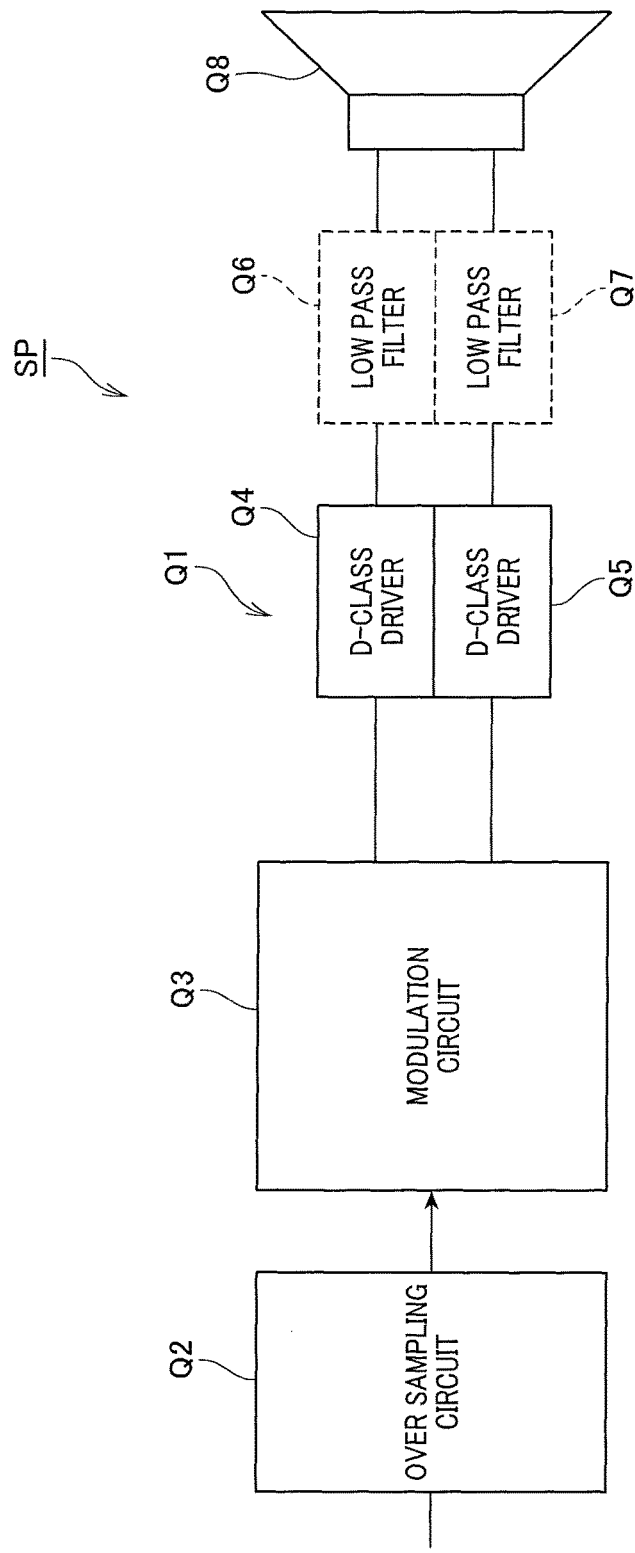
FIG. 1 is a diagram showing a speaker having a conventional digital amplifier.

FIG. 1 is a diagram showing an example of the circuit construction of a speaker SP having a conventional three-value outputting digital amplifier Q1.

As shown in FIG. 1, the speaker SP is configured to contain an over sampling circuit Q2, a modulation circuit Q3, a digital amplifier Q1 having a D-class driver Q4 associated with a positive electrode and a D-class driver Q5 associated with a negative electrode, low-pass filters Q6, Q7 provided in connection with the respective drivers, and a speaker main body Q8.

The over sampling circuit Q2 generates audio signals of a predetermined gradation at a predetermined sampling period on the basis of an input of audio signals from an audio device or the like, and outputs the audio signals to the modulation circuit Q3.

The modulation circuit Q3 performs signal processing such as $\Delta\Sigma$ modulation, quantization, etc. on the basis of an input from the over sampling circuit Q2, and outputs a signal representing a two-value to each of the D-class drivers Q4, Q5. As described later, the modulation circuit Q3 outputs a signal representing a proper two-value to each driver at a proper timing so that a three-value output is implemented on the basis of the differential output of the D-class drivers Q4, Q5. A modulation circuit using PWM or $\Delta\Sigma$ modulation (containing PDM) is known as the modulation circuit Q3.

FIG. 2(A) is a diagram showing an example of the circuit construction of the D-class driver Q4, and FIG. 2(B) is a diagram which schematically shows a simplified circuit construction of the D-class driver Q4.

The D-class driver Q4 is a circuit which has a switch Q9 having a p-MOS transistor functioning as a voltage-controlled switch, a switch Q10 having an n-MOS transistor functioning as a voltage-controlled switch, and a switch control circuit Q11 (for example, a gate driver) for operating the switches Q9, Q10 on the basis of the input from the modulation circuit Q3 and implements two-value signal output by combining ON/OFF of the switches Q9, Q10.

In FIG. 2, a power source voltage VH associated with the switch Q9 and a power source voltage VL associated with the switch Q10 satisfy VH>VL. The condition of the control voltage to be applied between the gate and the source varies according to the type of the transistor being used. However, there is no difference in that these switches function as a voltage control switch.

Figure 3:
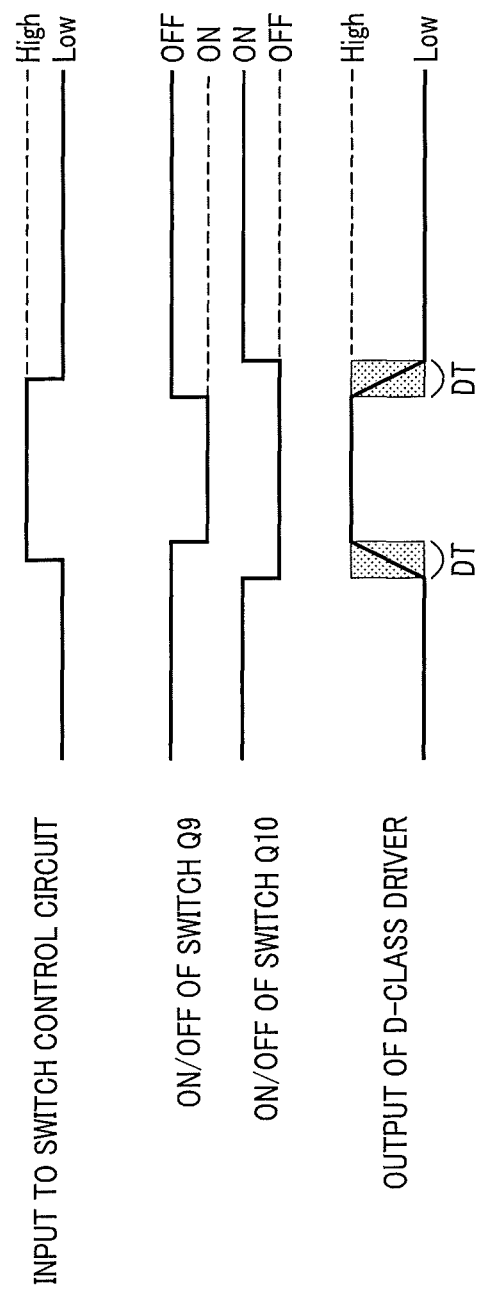
FIG. 3 shows timing charts representing input/output in the conventional D-class driver and the operation of each switch.

FIG. 3 is a timing chart showing the operations of the switches Q9 and Q10 in association with the relationship between the input to the switch control circuit Q11 and the output of the D-class driver Q4.

When the input to the switch control circuit Q11 represents Low under the circuit construction shown in FIG. 2, the gate of the p-MOS transistor of the switch Q9 is turned off to set the switch Q9 to an OFF state, and the gate of the n-MOS transistor of the switch Q10 is turned on to set the switch Q10 to an ON state, whereby a signal of Low (two-value signal) is output from the D-class driver Q4. On the other hand, when the input to the switch control circuit Q11 represents High, the switch Q9 is turned on, and the switch Q10 is turned off, whereby a signal of High (two-value signal) is output from the D-class driver Q4.

With respect to the switching of ON/OFF of the switches Q9 and Q10, it is impossible to instantaneously switch ON/OFF of the switches Q9 and Q10. In consideration of this matter, in order to avoid a risk that both the switches Q9 and Q10 are simultaneously turned on and thus a power source is short-circuited, a dead time DT (see FIG. 3) at which both the switches Q9 and Q10 are turned off is provided at the switching time of ON/OFF of the switches Q9 and Q10.

The construction of the D-class driver Q5 is the same as the construction of the D-class driver Q4, and thus the detailed description of the D-class driver Q5 based on the drawings is omitted.

In the example of FIG. 2, the D-class driver Q4 implements two-value output with the two transistors of the p-MOS transistor and the n-MOS transistor. However, there exist various circuit constructions such as a circuit construction that the two-value output is implemented with two n-MOS transistors.

The digital amplifier Q1 implements three-value output on the basis of the differential output of the D-class driver Q4 associated with the positive electrode and the D-class driver Q5 associated with the negative electrode. That is, a three-value output circuit associated with the digital amplifier Q1 is implemented by a circuit construction in which two two-value D-class drivers are combined as positive and negative electrodes for a differential output.

Figure 4:
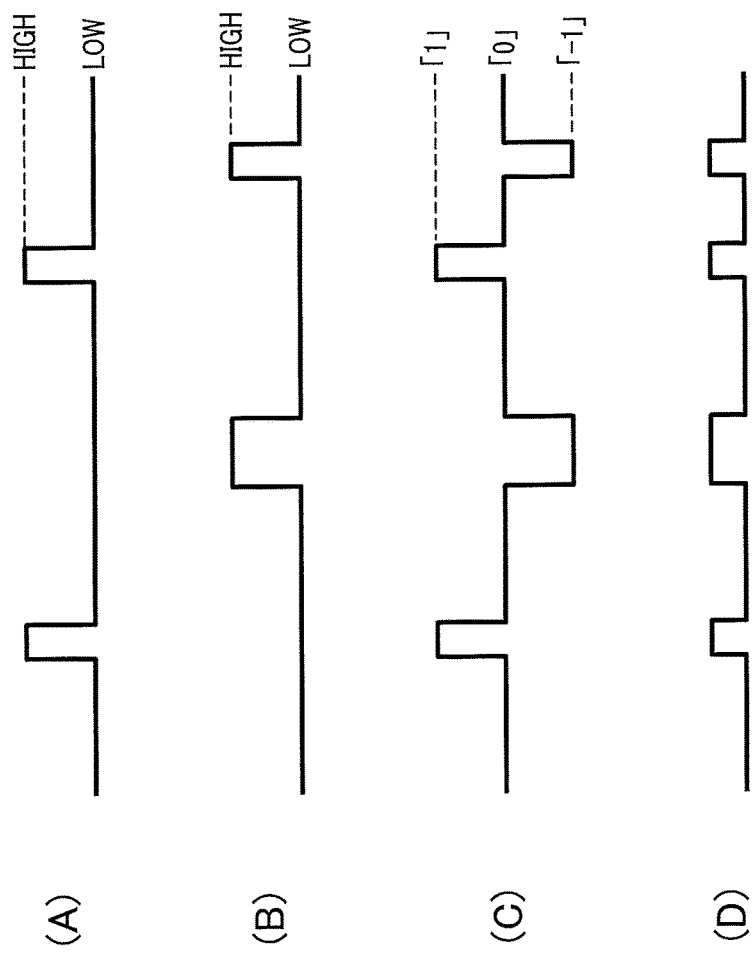
FIG. 4 shows timing charts representing the outputs of the conventional D-class drivers of positive and negative electrodes in association with the differential output of these drivers.

FIG. 4 is a timing chart showing the states of the respective outputs of the D-class drivers Q4, Q5 in association with the differential output of the D-class drivers Q4, Q5, wherein (A) shows the output of the D-class driver Q4, (B) shows the output of the D-class driver Q5, (C) shows the differential output of these drivers, and (D) shows a common mode associated with the differential output.

The 3-value output based on the digital amplifier Q1 will be described hereunder in detail with reference to FIG. 4.

As shown in FIG. 4(C), respective values of the three-value which are implemented by the differential output of the D-class drivers Q4, Q5 are represented as value "1", value "0" and value "−1". When the output of the D-class driver Q4 associated with the positive electrode is High and the output of the D-class driver Q5 associated with the negative electrode is Low, the value "1" is output. When the output of the D-class driver Q4/Q5 is Low/High, the value "−1" is output, and when the output of the D-class driver Q4/Q5 is Low/Low or High/High, the value "0" is output. Under the zero level, no current flows in a load, and an output off state can be implemented.

As shown in FIG. 4(D), a common mode noise corresponding to the half of the sum of the outputs of the D-class drivers Q4 and Q5 occurs.

The outputs of the D-class drivers Q4, Q5 are differentially output to coils (not shown) of the speaker main body Q8 through the low-pass filters Q6, Q7. A bobbin around which the coils are wound is driven according to the differential output to the coils, and a diaphragm supported by the bobbin vibrates and outputs sounds.

One of main features of the digital amplifier Q1 for outputting the three values as described above is that the digital amplifier Q1 can be operated with a lower power consumption than the two-value digital amplifier. The three-value digital amplifier Q1 is smaller in the level of quantization noise contained in an output than the two-value digital amplifier, and a filterless utilization method in which a speaker and an amplifier are directly connected to each other is adopted in some cases. A technical development to further enhance the power consumption reducing performance as a feature of the digital amplifier has recently progressed, and the three-value modulation is expected as one of effective methods for enhancing the power consumption reducing performance.

On the other hand, the conventional three-value digital amplifier Q1 in which two-value output circuits are combined with each other has a problem that the common mode noise occurs in the output and thus noise radiation caused by the common mode increases.

Particularly, when the three-value digital amplifier is used under such an environment that noise regulation is severe like an on-vehicle environment or the like, the cost of a countermeasure to noise is increased due to a filter, a shield or the like for suppressing radiation noise. Therefore, a three-value digital amplifier that does not output any noise radiation caused by the common mode has been required to be implemented.

Specifically, as shown in FIG. 4(D), in the prior art, the two-value drivers are combined with each other to implement the three-value output, and each output of the two-value drivers has a difference from ideal three-value output (the three values of balance output), and contains a very large common mode noise.

Figure 5:
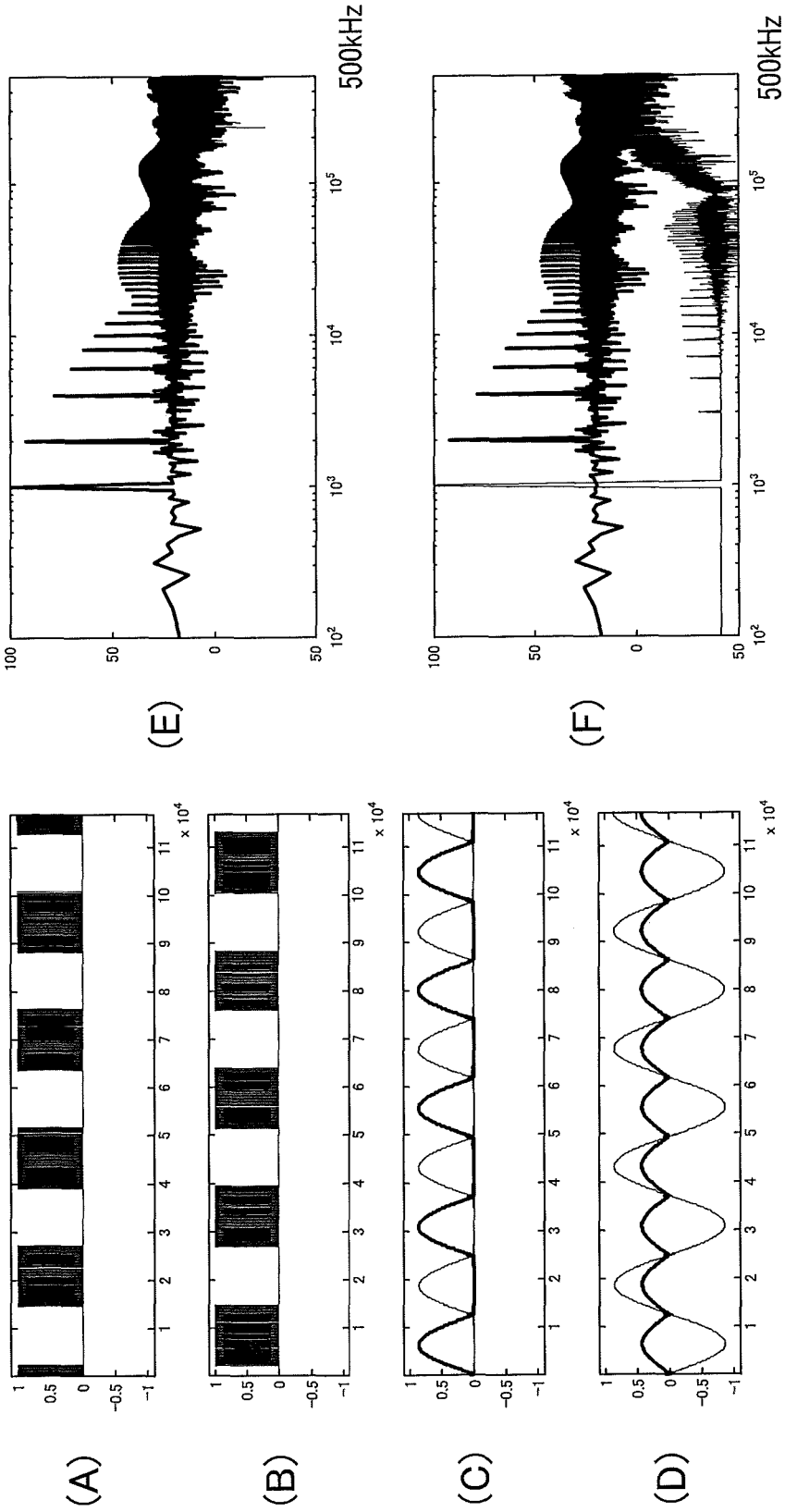
FIG. 5 is diagrams showing the waveforms of signal components of respective kinds of outputs and examples of spectra when an idealistic driver is assumed in the conventional digital amplifier.
Figure 6:
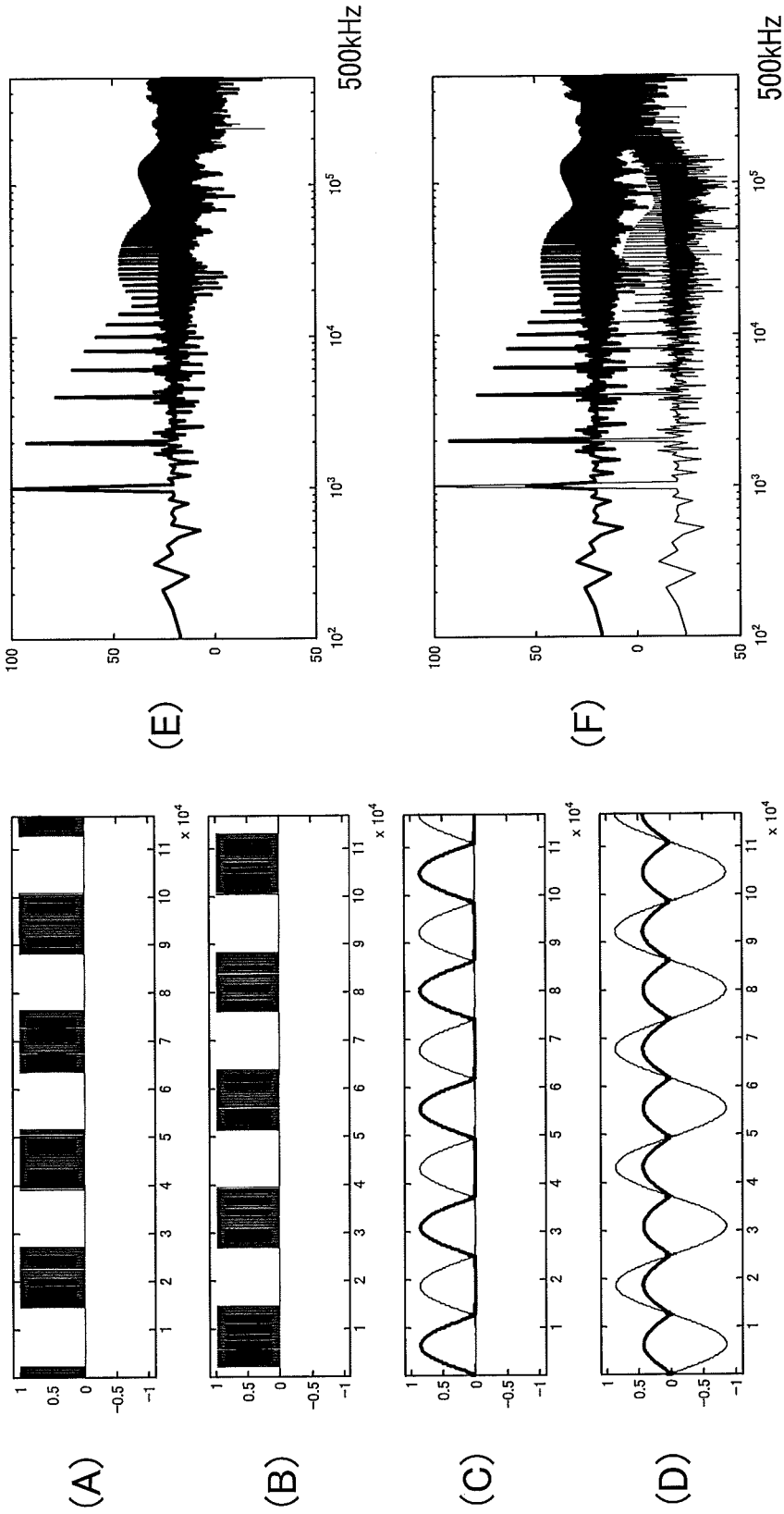
FIG. 6 is diagrams showing the waveforms of signal components of respective kinds of outputs and examples of spectra in a driver for which dispersion in performance is considered in the conventional digital amplifier.

FIGS. 5 and 6 show the waveforms of signal components in the neighborhood of an audio signal band and examples of spectra when a sine wave of 1 kHz is reproduced by the three-value digital amplifier Q1 of the prior art.

FIG. 5 shows a case where ideal drivers are assumed, and FIG. 6 shows a case where dispersion in performance of the respective driers is considered.

In FIGS. 5 and 6, (A) shows the waveform of an output of the D-class driver Q4 of the positive electrode, (B) shows the waveform of an output of the D-class driver Q5 of the negative electrode, (C) shows the waveform of an output (after passed through the low-pass filter) of each driver as a single body, and (D) shows the waveform of the differential output of the respective drivers and the waveform associated with the common mode noise. (E) is a diagram showing the spectrum of an output of the driver as a single body, and (F) is a diagram showing the spectrum of the differential output of the respective drivers and the spectrum associated with the common mode noise.

As shown in FIGS. 5 and 6, paying attention to the single body driver output of each driver, it is found that it has a very large common mode noise component. The common mode noise contains components till the audio band, and thus it is found that it is difficult to separate components with filters. Therefore, it is particularly difficult to apply to high-powered audio and apply to an environment in which restriction to noise radiation is severe like an on-vehicle environment or the like. When applied, it follows a high-cost noise countermeasure such as shielding of a connection cable extending till a speaker, insertion of a filter for removing common mode noise, etc. In the prior art, the existence of the common mode noise is unavoidable in principle, and it is impossible to reduce the common mode noise when the driver performance is improved.

As described above, the conventional three-value digital amplifier Q1 in which the two-value output circuits are combined with each other has a problem that it generates a large common mode noise at the output, and noise radiation caused by the common mode noise increases. In order to use the three-value digital amplifier under such an environment that noise regulation is severe like an on-vehicle environment or the like, a noise countermeasure based on a filter, shielding, etc. for suppressing radiation noise is required, and thus there is a problem that the cost increases. Therefore, a three-value digital amplifier that does not output any noise radiation caused by the common mode has been required to be implemented.

In consideration of the foregoing, a digital amplifier 1 of this embodiment operates as follows under the following construction to reduce the noise radiation caused by the common mode.

Figure 7:
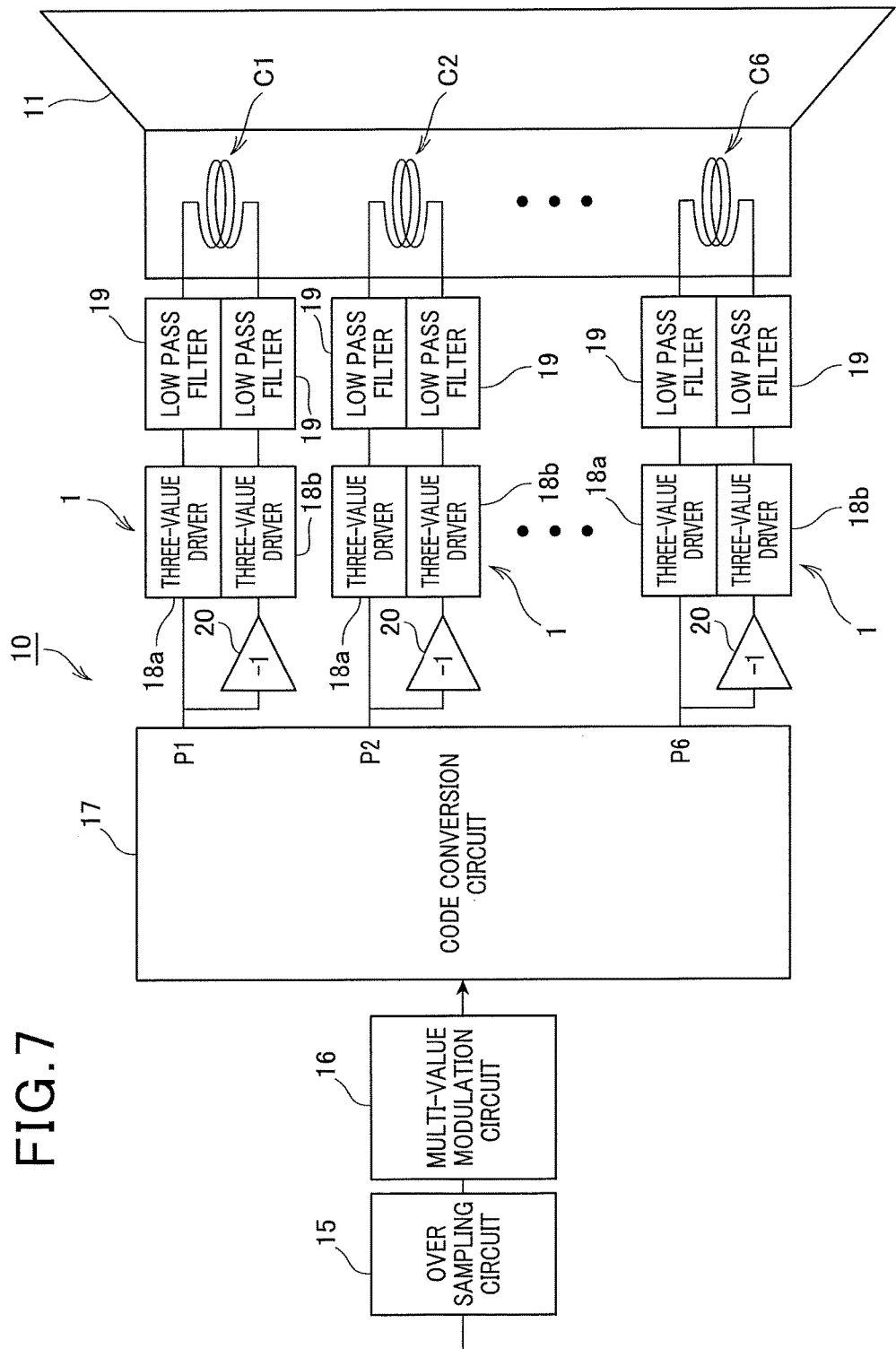
FIG. 7 is a diagram showing a digital speaker having a digital amplifier according to an embodiment.

FIG. 7 is a diagram showing the circuit construction of the digital speaker 10 to which the digital amplifier 1 according to this embodiment is applied.

The digital speaker 10 has a speaker body 11. The speaker body 11 has a bobbin (not shown) and a diaphragm (not shown) supported by the bobbin, and outputs sounds through vibration of the diaphragm caused by the actuation of the bobbin.

The digital speaker 10 according to this embodiment is a speaker adaptable to six channels, and the bobbin is provided with coils C1 to C6 of six layers corresponding to the respective channels. The coils C1 to C6 are provided to be stacked and multilayered in the peripheral direction of the bobbin, for example, and are provided so that the respective layers are spaced from one another in the axial direction of the bobbin.

As shown in FIG. 7, the digital speaker 10 is configured to contain an over sampling circuit 15, a multi-value modulation circuit 16, a code conversion circuit 17 (pre-stage circuit), digital amplifiers 1 each of which is provided in connection with each channel, and low-pass filters 19 which are provided in connection with three-value drivers 18a, 18b which is equipped to each digital amplifier 1.

The over sampling circuit 15 generates sound signals of predetermined gradations at a predetermined sampling period on the basis of an input of audio signals from an audio device or the like, and outputs the sound signals to the multi-value modulation circuit 16.

The multi-value modulation circuit 16 performs predetermined signal processing such as ΔΣ modulation, quantization, etc. on the basis of an input from the over sampling circuit 15, generates multi-value sound signals of six channels and outputs the multi-value sound signals to the code conversion circuit 17.

The code conversion circuit 17 generates signals representing three values of six channels on the basis of multi-value sound signals of six channels input from the multi-value modulation circuit 16, and outputs, through six ports P1 to P6, these signals to the respective six digital amplifiers 1 each of which is provided in association with each channel.

The code conversion circuit 17 (pre-stage circuit) is equipped with a function of distributing a multi-value scalar output to a three-value parallel output, properly generates signals representing three values of six channels so that each of the coils C1 to C6 is properly operated, and properly outputs the signal from each of the ports P1 to P6 at proper timing.

As shown in FIG. 7, each digital amplifier 1 has a three-value driver 18a associated with the positive electrode (a signal output circuit associated with the positive electrode) and a three-value driver 18b associated with the negative electrode (a signal output circuit associated with the negative electrode).

The signal representing the three-value output from the code conversion circuit 17 is input to the three-value driver 18a associated with the positive electrode and branched, inverted by an inverting circuit 20, and then input to the three-value driver 18b associated with the negative electrode.

That is, signals representing three values which are mutually inverted therebetween are input to the three-value driver 18a associated with the positive electrode and the three-value driver 18b associated with the negative electrode at the same timing.

Figure 8:
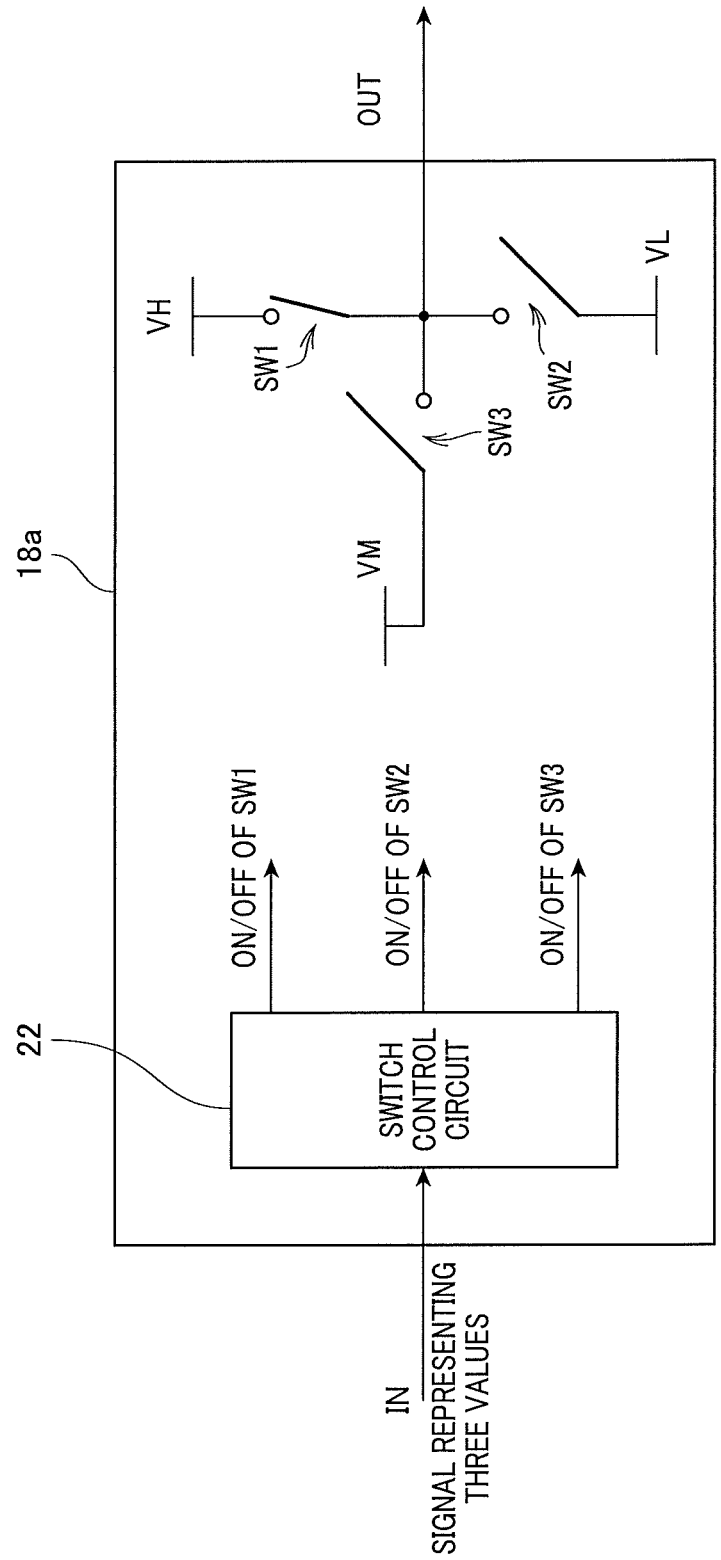
FIG. 8 is a diagram showing a three-value driver structure.

FIG. 8 is a conceptual diagram showing the construction of the three-value driver 18a associated with the positive electrode. FIG. 9 is a diagram showing the relationship between the state of each switch (described later) equipped to the three-value driver 18a and the output of the three-value driver 18a concerned, wherein (A) shows the above relationship with a circuit diagram, and (B) shows the above relationship with a table.

As omitted from the drawings, the three-value driver 18b associated with the negative electrode has the same construction as the three-value driver 18a.

As shown in FIG. 8, the three-value driver 18a has power sources which respectively output three kinds of potentials (power source voltages VH, VM, VL), three switches SW1, SW2 and SW3 connected to the respective power sources, and a switch control circuit 22 (gate driver, for example) for driving the respective switches SW1, SW2 and SW3 on the basis of an input from the code conversion circuit 17.

Here, the power source voltage VL<VM<VH is satisfied, and VM is ideally equal to the intermediate potential between VL and VH, that is, VM=(VL+VH)/2. As the specific power source voltages, it may be possible that VH is set as a plus power source, VL is set as a minus power source (VL=−VH) and VM is set to 0V (GND), or it may be possible that VL is set to 0V (GND) and VM=VH/2, that is, only the plus power source may be used. However, a proper circuit construction may be selected according to an application.

The three-value driver 18a executes the three-value signal output by switching of the respective switches SW1, SW2 and SW3 with the switch control circuit 22.

Specifically, it is assumed that a signal representing three-value to be input is enabled to have value "1", value "−1" and value "0" as shown in FIGS. 9(A), (B). When the input is the value "1", only the switch SW1 is turned on, and a signal of High is output. When the input is the value "−1", only the switch SW2 is turned on, and a signal of Low is output. When the input is the value "0", only the switch SW3 is turned on, and a signal of Middle is output. When all the switches are turned off, the output is set to a high impedance state.

Figure 10:
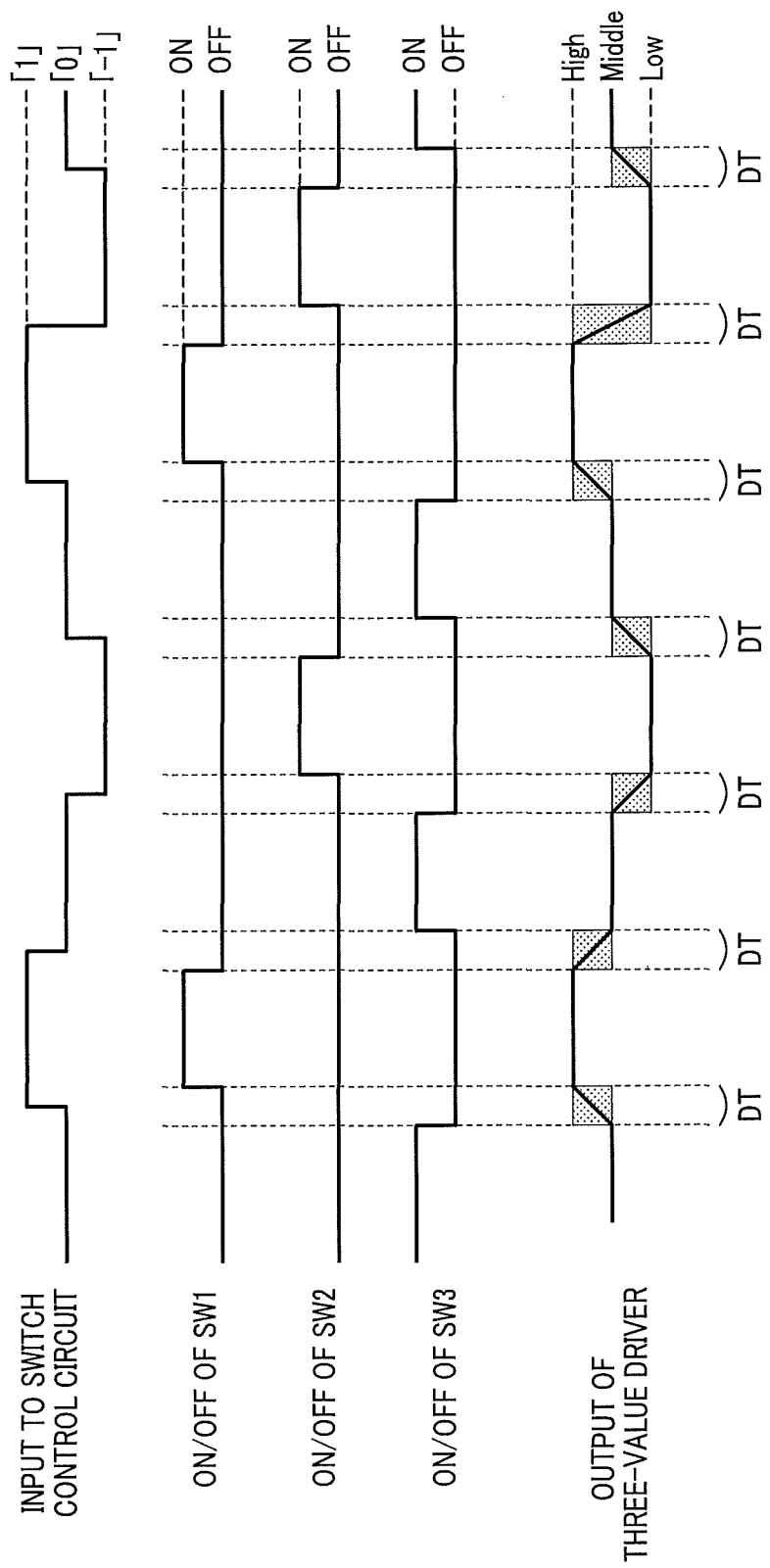
FIG. 10 is a timing chart showing the operations of respective switches in association with the relationship between an input to a switch control circuit equipped to the three-value driver and the output of the three-value driver.

FIG. 10 is a timing chart showing the operations of the respective switches SW1, SW2 and SW3 equipped to the three-value driver 18a in association with the relationship between the input to the switch control circuit 22 equipped to the three-value driver 18a and the output of the three-value driver 18a.

When the input to the switch control circuit 22 represents the value "1" under the circuit construction shown in FIG. 8, the signal of High is output from the three-value driver 18a by turning on only the switch SW1. Furthermore, when the input to the switch control circuit 22 represents the value "−1", only the switch SW2 is turned on, and a signal of Low is output. When the input to the switch control circuit 22 represents the value "0", only the switch SW3 is turned on, and a signal of Middle is output.

Here, in an actual circuit, the response time of a switch which can be implemented is finite. Therefore, in order to avoid a situation that two switches are turned on simultaneously and thus short-circuited, a time margin is required at the switching time of the respective switches SW1, SW2 and SW3. Therefore, as shown in FIG. 10, the switch control circuit 22 executes the switching of the switches through a dead time TD at which all the switches are turned off (the output is set to a high impedance state) at the switching operation of each of the switches SW1, SW2 and SW3. That is, the switch control circuit 22 turns on only the corresponding one switch and turns off the other switches for the input values "1", "−1" and "0", thereby obtaining the driving states of the three values. However, when the state is changed, the switch control circuit 22 controls the switches so that the state temporarily passes through a state that all the switches are turned off, and then shifts to the next state.

Figure 11:
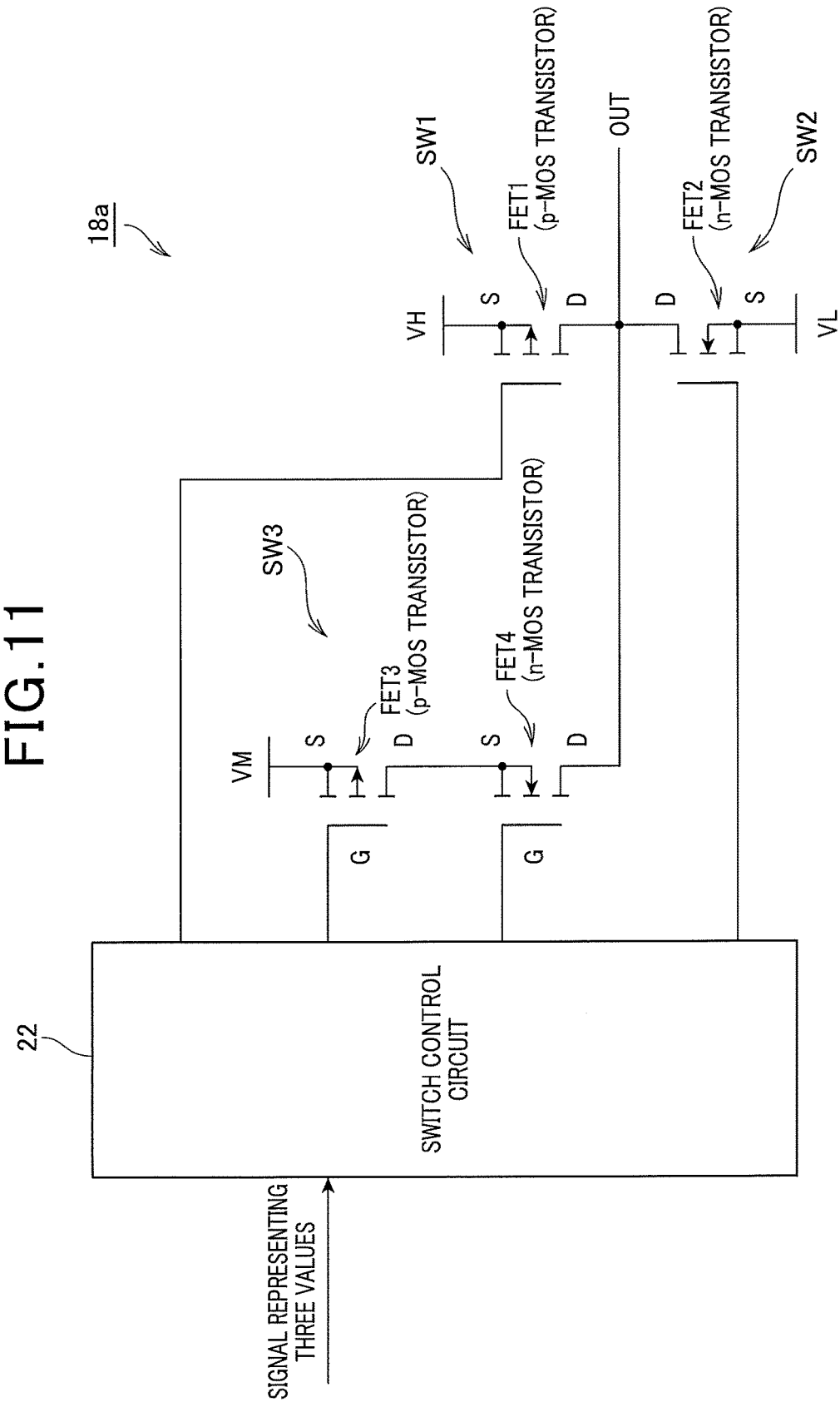
FIG. 11 is a diagram showing the construction of the three-value driver in detail.

FIG. 11 is a diagram showing the circuit construction of the three-value driver 18a associated with the positive electrode in more detail. The circuit construction of the three-value driver 18b associated with the negative electrode is the same as the three-value driver 18a.

As shown in FIG. 11, the switch SW1 is constructed by a p-MOS transistor (hereinafter referred to as "FET1"). The switch SW2 is constructed by an n-MOS transistor (hereinafter referred to as "FET2").

The switch SW3 is constructed by a p-MOS transistor (hereinafter referred to as "FET3") connected to a power source of a power source voltage VM, and an n-MOS transistor (hereafter referred to as "FET4") connected to FET3. That is, as is apparent from the comparison between FIG. 2(A) and FIG. 11, the three-value driver 18a has a circuit construction that FET3 and FET4 for driving the intermediate level are added to the two-value D-class driver.

Here, the output voltage Vout of the three-value driver 18a varies in the range from the power source voltage VL to VH, and a condition satisfying VM<Vout or a condition satisfying VM>Vout may occur. Therefore, it is required to construct a voltage controlled switch in which the switch SW3 can be surely turned on/off under both the conditions. In consideration of this, the switch SW3 is constructed by combining FET3 as a p-MOS transistor and FET4 as an n-MOS transistor. That is, in consideration of the fact that the off-state can be implemented in the case of only one of the bias conditions when one MOS transistor is used, the switch SW3 is constructed by combining two MOS transistors which are different in direction (different in forward-bias direction). Accordingly, the switch SW3 can be surely turned on/off under both the conditions of VM<Vout and VM>Vout.

Figure 12:
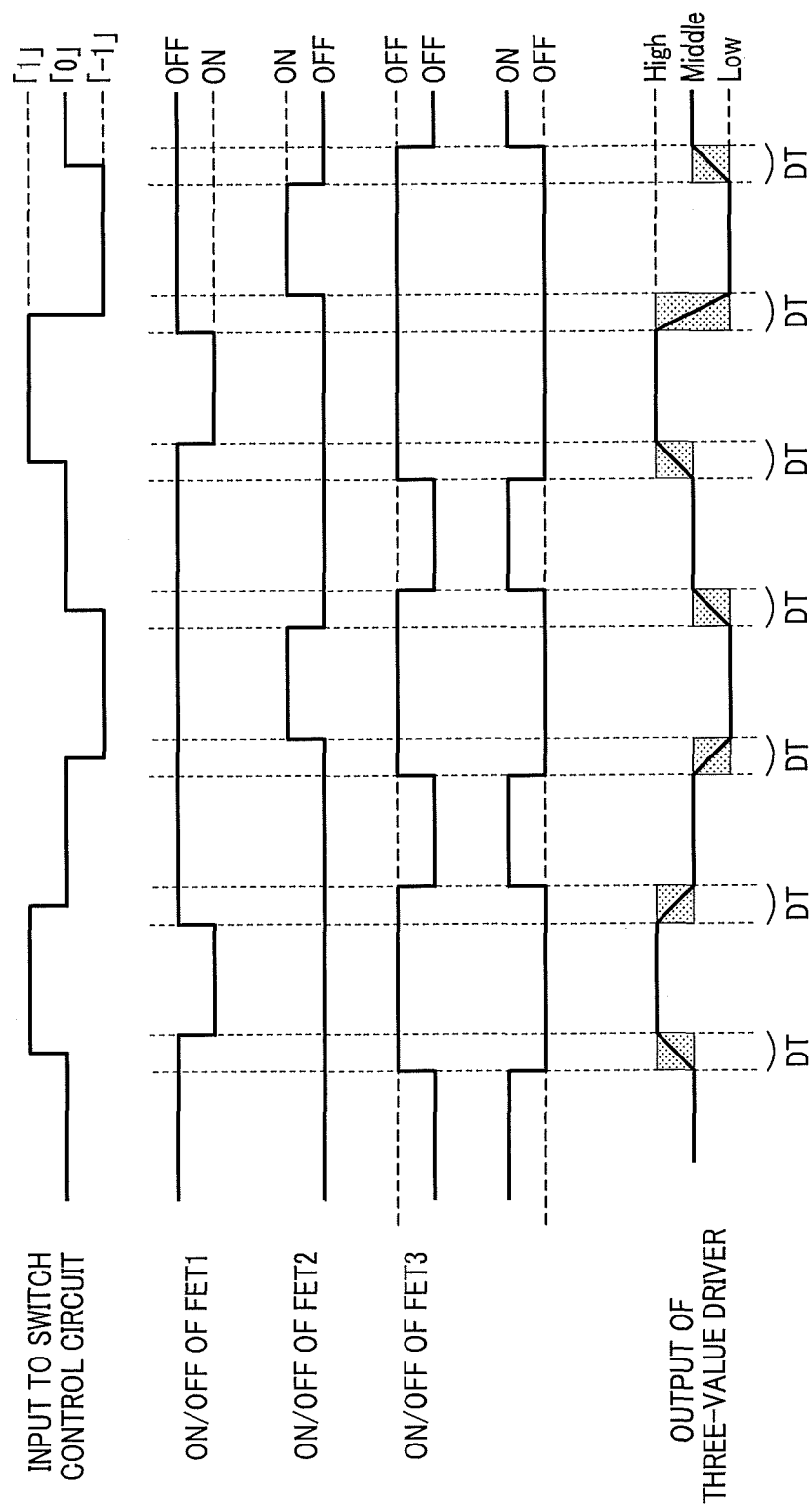
FIG. 12 is a timing chart showing the operations of respective MOS transistors in association with the input to the switch control circuit equipped to the three-value driver and the output of the three-value driver.

FIG. 12 is a timing chart showing the operation of FET1, 2, 3 and 4 in association with the relationship between the input to the switch control circuit 22 and the output of the three-value driver 18a.

As shown in FIG. 12, the switch control circuit 22 sets only FET1 to the ON-state when the input represents the value "1", whereby a signal of High is output. The switch control circuit 22 sets only FET2 to the ON-state when the input represents the value "−1", whereby a signal of Low is output. When the input represents the value "0", the switch control circuit 22 controls the gate voltage so that FET3 and FET4 are set to the ON-state, whereby a signal of Middle is output.

Furthermore, as shown in FIG. 12, a dead time DT for which all the MOS transistors are set to OFF-state (high impedance state) is provided at the time when each MOS transistor is switched, thereby preventing occurrence of a condition that the respective MOS transistors are simultaneously turned on and thus through-current flows.

FIGS. 11 and 12 show an example of the circuit construction in which the switch SW1 of FIG. 8 is constructed by a p-MOS transistor, the switch SW2 is constructed by an n-MOS transistor and the switch SW3 is constructed by combining a p-MOS transistor and an n-MOS transistor. However, the circuit construction is not limited to the above construction, and any circuit construction may be designed insofar as it can embody the basic construction of FIG. 8.

For example, the switches SW1, 2 may be constructed by a circuit construction of n-MOS/n-MOS which are frequently used for normal two-value drivers, and circuit constructions using other elements in place of the MOS transistor are possible. The construction of the switch SW3 is not limited to the example of FIG. 11 insofar as it can achieve performance as a bidirectional switch.

The digital amplifier 1 implements a three-value output on the basis of the differential output of the three-value driver 18a associated with the positive electrode and the three-value driver 18b associated with the negative electrode.

Figure 13:
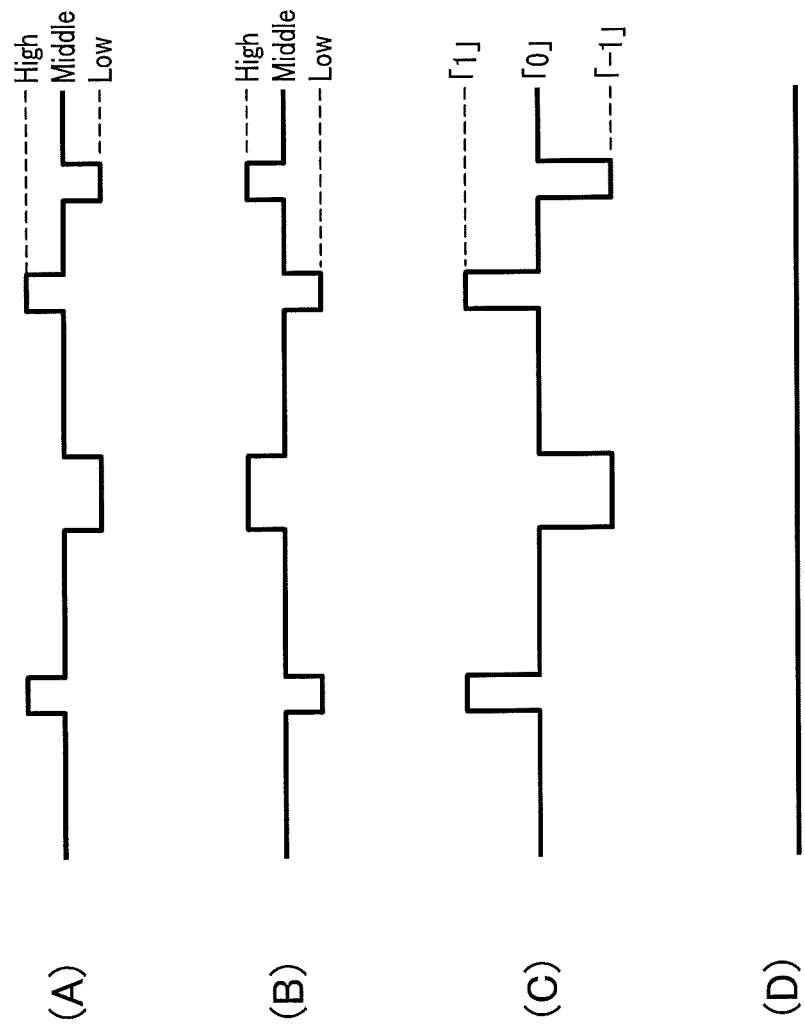
FIG. 13 is a timing chart showing the output states of the three-value drivers of the positive and negative electrodes in association with the relationship of the differential output of the three-value drivers of the positive electrode and the negative electrode.

FIG. 13 is a timing chart representing the states of respective outputs of the three-value drivers 18a, 18b in association with the differential output of the three-value drivers 18a, 18b, wherein (A) represents the output of the three-value driver 18a, (B) shows the output of the three-value driver 18b and (C) shows the differential output of these drivers. (D) shows a common mode associated with the differential output.

The three-value output based on the digital amplifier 1 will be described in detail with reference to FIG. 13.

As shown in FIG. 13(A) and FIG. 13(B), three-value signals output from the three-value drivers 18a and 18b are set to be inverted to each other. As described with reference to FIG. 7, this relationship is implemented by the construction that three-value representing signals which are inverted to each other are input from the code conversion circuit 17 to the three-value driver 18a associated with the positive electrode and the three-value driver associated with the negative electrode at the same timing.

As shown in FIGS. 13(A), (B), the output of the three-value driver 18b is executed in synchronization with the output of the three-value driver 18a. When the output of the three-value driver 18a is High, the corresponding output of the three-value driver 18b is Low to which High is inverted. Conversely, when the output of the three-value driver 18a is Low, the corresponding output of the three-value driver 18b is High to which Low is inverted. Furthermore, when the output of the three-value driver 18a is Middle, the output of the three-value driver 18b is Middle.

It is assumed that the respective three values implemented by the differential output of the three-value drivers 18a, 18b are represented as the value "1", the value "0" and the value "−1" as shown in FIG. 13C. When the output of the three-vale driver 18a associated with the positive electrode is High and the corresponding output of the three-value driver 18b associated with the negative electrode is Low, the output of the value "1" is executed. When the output of the three-value driver 18a associated with the positive electrode is Low and the corresponding output of the three-value driver 18b associated with the negative electrode is High, the output of the value "−1" is executed. Furthermore, when both the outputs of the three-value drivers 18a and 18b are Middle, the output of the value "0" is executed.

As described above, according to this embodiment, the three-value driver 18a associated with the positive electrode (the signal output circuit associated with the positive electrode) and the three-value driver 18b associated with the negative electrode (the signal output circuit associated with the negative electrode) respectively output three-value signals which are inverted to each other, and implement the three-value output on the basis of the differential output of the positive electrode and the negative electrode.

The outputs of the three-value drivers 18a, 18b are differentially output to the coils of the speaker main body 11 through the low pass filters 19. In connection with the differential output to the coils, the bobbin around which the coils are wound is actuated, and the diaphragm supported by the bobbin vibrates, and outputs sounds.

In this embodiment, the three-value drivers 18a, 18b which can output three values in the form of a single body are provided to implement the digital amplifier 1 having three-value output capability which suppresses the common mode causing noise radiation and prevents the output of the common mode. That is, the cost of a countermeasure to noise such as shield or the like can be reduced by suppressing the factor causing occurrence of noise, thereby implementing the digital amplifier that is suitable for audio reproduction and outputs three values with low power consumption under an on-vehicle mount environment in which the restriction to radiation is severe.

Specifically, in the case of the construction that the output of three values is implemented by the differential output between the output of the three-value driver 18a associated with the positive electrode and the output of the three-value driver 18b associated with the negative electrode to which the output of the three-value driver 18a is inverted as in the case of the digital amplifier 1 according to this embodiment, the common mode is equal to zero under an ideal state as shown in FIG. 11(D), and the common mode noise is suppressed.

Figure 14:
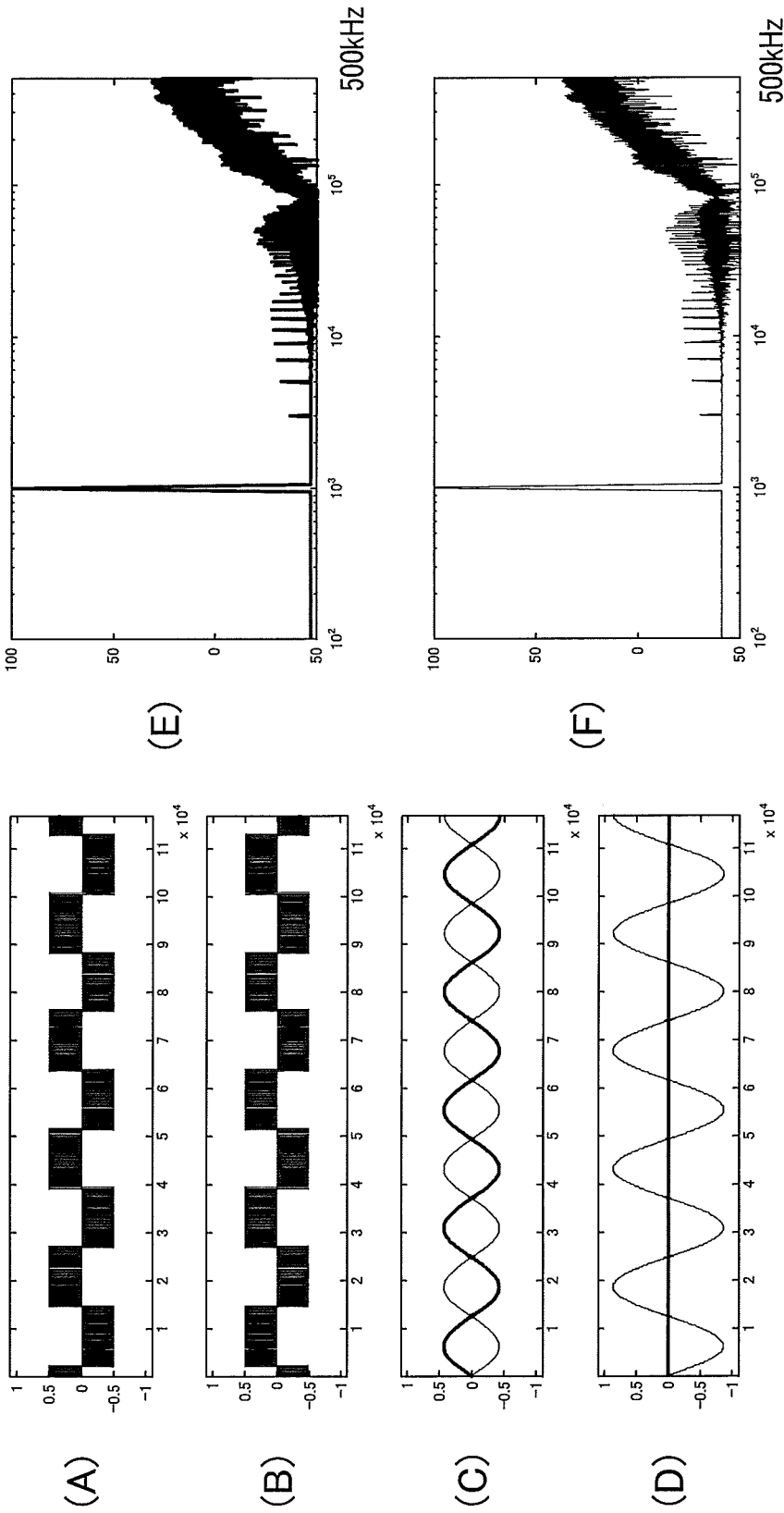
FIG. 14 are diagrams showing the waveforms of signal components of respective kinds of outputs and an example of spectrum when an ideal driver is assumed in the digital amplifier.
Figure 15:
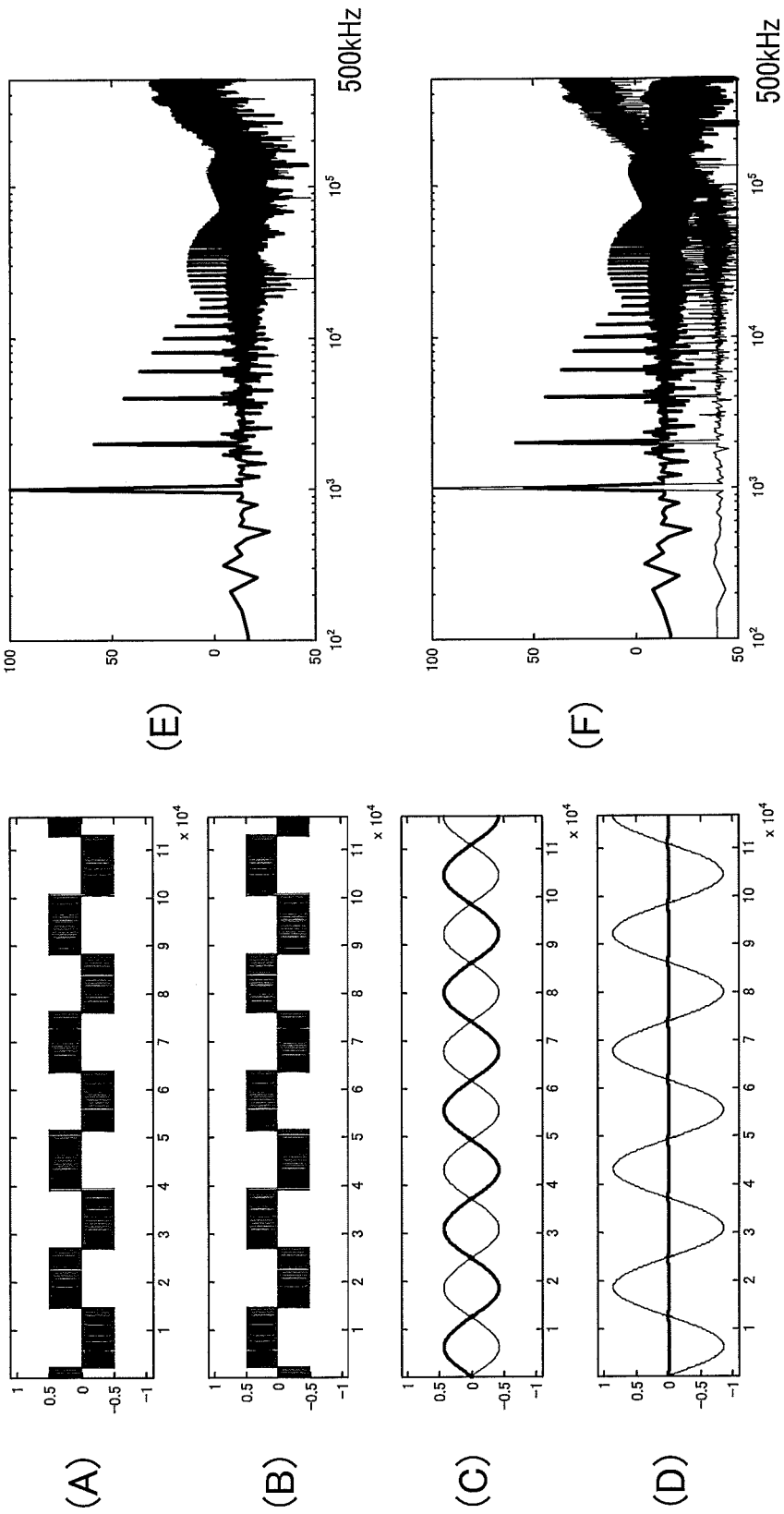
FIG. 15 are diagrams showing the waveforms of signal components of respective kinds of outputs and an example of spectrum in a driver for which dispersion in performance is considered in the digital amplifier.

FIGS. 14 and 15 are diagrams showing the waveforms of signal components in the neighborhood of an audio signal band and an example of the spectrum when a sine wave of 1 kH is reproduced by the digital amplifier 1 according to this embodiment.

FIG. 14 shows a case where an ideal three-value driver is assumed, and FIG. 15 is a case where dispersion in performance of the respective three-value drivers is considered.

In FIGS. 14 and 15, (A) show the waveform of the output of the three-value driver 18a of the positive electrode, (B) shows the waveform of the output of the three-value driver 18b of the negative electrode, (C) shows the waveform of the output of each three-value driver as a single body (after passed through the low pass filter), and (D) shows the waveform of the differential output of the respective three-value drivers and the waveform associated with the common mode noise. (E) is a diagram showing the spectrum of the output of the three-value driver as a single body, and (F) is a diagram showing the spectrum of the differential output of the respective three-value drivers and the spectrum associated with the common mode noise.

According to this embodiment, as shown in FIG. 14, it is found that each of the three-value drivers 18a, 18b of the positive and negative electrodes contains a perfect audio signal in principle, and has a good S/N as a single three-value driver output body. It is found that the noise components are subjected to noise shaping and are very small in level in the audio band. Furthermore, in the circuit construction according to this embodiment, the outputs of the three-value drivers of the positive and negative electrodes are inverted to each other, and thus the common mode is equal to "0" in the whole signal band (excluding DC component) in principle. Accordingly, the common mode noise is suppressed.

Actually, there occurs a difference from an ideal output due to distortion of the three-value driver as a single body, variation in performance among the respective three-value drivers or the like, and thus the common mode noise is not completely equal to zero. However, the noise level can be sufficiently reduced as compared with the prior art by outputting the intermediate potential and enabling balanced operation.

For example, when the MOS transistor is adopted for the three-value driving circuit, the difference in positive and negative pulse amplitudes, the difference in rising and falling characteristics at pulse edges, noises caused by the dead time DT, etc. are considered as factors which degenerate the common noise dependently on the performance of the gate of the MOS transistor. All the factors can be improved to suppress occurrence of the common mode by improving the performance of the three-value driver to approach the waveforms to ideal three-driven waveforms. The power source voltages VL, VM and VH are surely supplied to minimize the difference in ON-resistance between MOS transistors at the high side and the low side (FET1 and FET2) and reduce the ON-resistance containing the MOS transistors, wires, etc., thereby enabling a design in which the difference in signal amplitude at the positive and negative sides with the intermediate level at the center is clipped to a small level. With respect to the difference in rising and falling characteristics at the pulse edges and the effect of the dead time DT, the relative degree of influence to the pulse waveforms can be reduced.

As described above, in the digital amplifier 1 according to this embodiment, the three-value driver 18a associated with the positive electrode (the signal output circuit associated with the positive electrode) and the three-value driver 18b associated with the negative electrode (the signal output circuit associated with the negative electrode) output three-value signals which are inverted to each other, and the output of the three values can be performed on the differential output of the positive and negative electrodes.

According to the construction, as described above, the reduction of noises caused by the common mode can be performed as comparison with the digital amplifier Q1 for outputting three values.

In the digital amplifier 1 according to this embodiment, a signal representing three values is input from the code conversion circuit 17 as the pre-stage circuit to the three-value driver 18b associated with the positive electrode, and also the signal representing the three values is branched, inverted and input to the three-value driver 18b associated with the negative electrode.

The three-value drivers 18a, 18b output the mutually inverted three-value signals on the basis of the inputs thereto.

According to this construction, the three-value signals output from the three-value drivers 18a, 18b associated with the positive and negative electrodes can be properly set to have a mutually-inverted relationship.

In the digital amplifier 1 according to this embodiment, each of the three-value drivers 18a, 18b of the positive and negative electrodes has the power sources which output three kinds of potentials, the three switches SW1, SW2 and SW3 connected to the respective power sources, and the switch control circuit 22 for operating the respective switches SW1, SW2 and SW3 on the basis of the input thereto, and outputs the three-value signal by switching the switches SW1, SW2 and SW3 with the switch control circuit 22.

Accordingly, the signal output of three values based on the three-value drivers 18a, 18b can be properly implemented by using the potential difference of the respective power sources.

The embodiment described above is merely an example of the present invention, and any modification and application may be performed within the scope of the present invention.

The digital amplifier 1 according to this embodiment is broadly applicable to digital speakers such as an on-vehicle speaker, a speaker installed in an audio device, other types general-purse speakers, etc.

DESCRIPTION OF REFERENCE NUMERALS

1 digital amplifier
10 digital speaker
17 code conversion circuit (pre-stage circuit)
18a three-value driver (signal output circuit associated with positive electrode)
18b three-value driver (signal output circuit associated with negative electrode)
20 inverting circuit
22 switch control circuit
SW1, SW2, SW3 switch

The invention claimed is:
1. An audio device comprising:
a speaker main body;
a plurality of digital amplifiers each of which corresponds to respective channel; and
a plurality of coils,
wherein each of the plurality of digital amplifiers comprises:
a positive electrode signal output circuit that is associated with a positive electrode and that outputs three-value positive signals; and a negative electrode signal output circuit that is associated with a negative electrode and that outputs negative signal which is inverted from the positive signal to be output from the positive electrode signal output circuit and which maintains in signal amplitude of the positive signal, the negative electrode signal output circuit outputting the inverted signal at a same timing as a timing of the positive signal, wherein the positive electrode signal output circuit and the negative electrode signal output circuit are connected to each of the plurality of coils, and the three-value signals that are inverted each other and that have the same amplitude are input at the same timing to each of the plurality of coils.

2. The audio device according to claim 1, wherein a signal representing three values is input from a pre-stage circuit to the positive electrode signal output circuit, the signal representing the three values is branched, inverted and input to the negative electrode signal output circuit.

3. The audio device according to claim 2, wherein each of the positive electrode signal output circuit and the negative electrode signal output circuit has power sources having three kinds of potential outputs, three switches connected to the respective power sources, and a switch control circuit for operating the respective switches, and outputs a three-value signal by switching the respective switches with the switch control circuit.

4. The audio device according to claim 3, wherein a period for which all the three switches are turned off is provided at a switching time when the three switches are switched by the switch control circuit.

* * * * *